(12) United States Patent
Yu

(10) Patent No.: US 6,531,358 B1
(45) Date of Patent: Mar. 11, 2003

(54) METHOD OF FABRICATING CAPACITOR-UNDER-BIT LINE (CUB) DRAM

(75) Inventor: Chih-Hsing Yu, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/850,990

(22) Filed: May 9, 2001

(51) Int. Cl.[7] ......................................... H01L 21/8242
(52) U.S. Cl. .................. 438/253; 438/254; 438/255; 438/256; 438/238; 438/239
(58) Field of Search ................. 438/387, 239, 438/238, 253–255, 256

(56) References Cited

U.S. PATENT DOCUMENTS

| | | | |
|---|---|---|---|
| 5,401,681 A | * 3/1995 | Dennison | |
| 5,705,438 A | 1/1998 | Tseng | 438/238 |
| 5,866,453 A | 2/1999 | Prall et al. | 438/253 |
| 5,893,734 A | * 4/1999 | Jeng et al. | 438/239 |
| 6,090,697 A | 7/2000 | Xing et al. | 438/618 |
| 6,100,129 A | 8/2000 | Tu et al. | 438/238 |
| 6,300,191 B1 | * 10/2001 | Yu et al. | 438/253 |
| 6,344,391 B1 | * 2/2002 | Lee et al. | 438/253 |

* cited by examiner

Primary Examiner—Matthew Smith
Assistant Examiner—V. Yevsikov
(74) Attorney, Agent, or Firm—George O. Saile; Stephen B. Ackerman; Rosemary L. S. Pike

(57) ABSTRACT

A method for fabricating a CUB DRAM device having an enlarged process window for bit line contact patterning is deacribed. A plurality of capacitor node contact junctions and a bit line junction are provided in a semiconductor substrate. A node contact plug is formed through a first insulating layer to each of the capacitor node contact junctions. A bit line contact plug is formed to the bit line junction. Openings are etched through a second insulating layer to each of the node contact plugs. A polysilicon layer is conformally deposited within the openings and then recessed below the top of the openings wherein each of the polysilicon layers forms a bottom plate electrode of a capacitor. A capacitor dielectric layer is formed overlying the bottom plate electrodes and the second insulating layer. A polysilicon layer is deposited overlying the capacitor dialectic layer and patterned to form top capacitor plates overlying each of the bottom plate electrodes to complete the capacitors. An opening is etched through a third and the second insulating layers between the capacitors to the bit line contact plug and filled with a conducting layer to form a bit line to complete fabrication of a DRAM with CUB cell in an integrated circuit device.

26 Claims, 9 Drawing Sheets

US 6,531,358 B1

METHOD OF FABRICATING CAPACITOR-UNDER-BIT LINE (CUB) DRAM

BACKGROUND OF THE INVENTION (1) Field of the Invention

The present invention relates to a method of fabricating a DRAM device, and more particularly, to a method of forming a capacitor-under-bit line DRAM device having an enlarged process window in the fabrication of an integrated circuit device.

(2) Description of the Prior Art

Capacitors are critical components in the integrated circuit devices of today. A dynamic random access memory (DRAM) cell typically is composed of a pass transistor (for switching) and a storage capacitor. The state-of-the-art DRAM cell has typically either a stacked capacitor or a trench capacitor; referred to as "stack cell" or "trench cell", respectively. Among stack cells, the capacitor can be fabricated either above or below the bit-line, referred to as Capacitor Over Bit-line (COB) or Capacitor Under Bit-line (CUB) structures. One of the major limitations for scaling down a CUB DRAM is the insufficient accuracy of lithography, especially in the patterning of bit line contacts. Isolation between storage nodes and bit line contacts or isolation between plates and bit line contacts can fail due to mis-alignment issues.

U.S. Pat. No. 6,090,697 to Xing et al and U.S. Pat. No. 5,705,438 to Tseng teach CUB processes. U.S. Pat. No. 6,100,129 to Tu et al discloses a process for making a capacitor. U.S. Pat. No. 5,866,453 to Prall et al teaches another capacitor process.

SUMMARY OF THE INVENTION

Accordingly, it is a primary object of the invention to provide an effective and very manufacturable process for fabricating a capacitor-under-bit line (CUB) DRAM device.

Another object of the present invention is to provide a method for fabricating a CUB DRAM device that is resistant to lithography mis-alignment.

A further object is to provide a method for fabricating a CUB DRAM device having a recessed lower electrode.

Yet another object of the invention is to provide a method for fabricating a CUB DRAM device having enlarged top plate openings.

Yet another object is to provide a method for fabricating a CUB DRAM device having an enlarged process window for bit line contact patterning.

In accordance with the objects of this invention, a method for fabricating a CUB DRAM device having an enlarged process window for bit line contact patterning is achieved. A plurality of capacitor node contact junctions and a bit line junction are provided in a semiconductor substrate. A node contact plug is formed through a first insulating layer to each of the capacitor node contact junctions. A bit line contact plug is formed to the bit line junction. A second insulating layer is deposited overlying the node contact plugs. Openings are etched through the second insulating layer to each of the node contact plugs. An polysilicon layer is conformally deposited overlying the second insulating layer and within the openings. The polysilicon layer is recessed below the top of the openings wherein each of the polysilicon layers forms a bottom plate electrode of a capacitor. A capacitor dielectric layer is formed overlying the bottom plate electrodes and the second insulating layer. A polysilicon layer is deposited overlying the capacitor dialectic layer and patterned to form top capacitor plates overlying each of the bottom plate electrodes to complete the capacitors. A third insulating layer is deposited overlying the capacitors. An opening is etched through the third and second insulating layers between the capacitors to the bit line contact plug and filled with a conducting layer to form a bit line to complete fabrication of a DRAM with CUB cell in an integrated circuit device.

BRIEF DESCRIPTION OF THE DRAWINGS

In the following drawings forming a material part of this description, there is shown:

FIGS. 5 through 14 are schematic cross-sectional representations of a preferred embodiment of the present invention.

DESCRIPTION OF THE PREFERRED EMBODIMENTS

Figure 1:
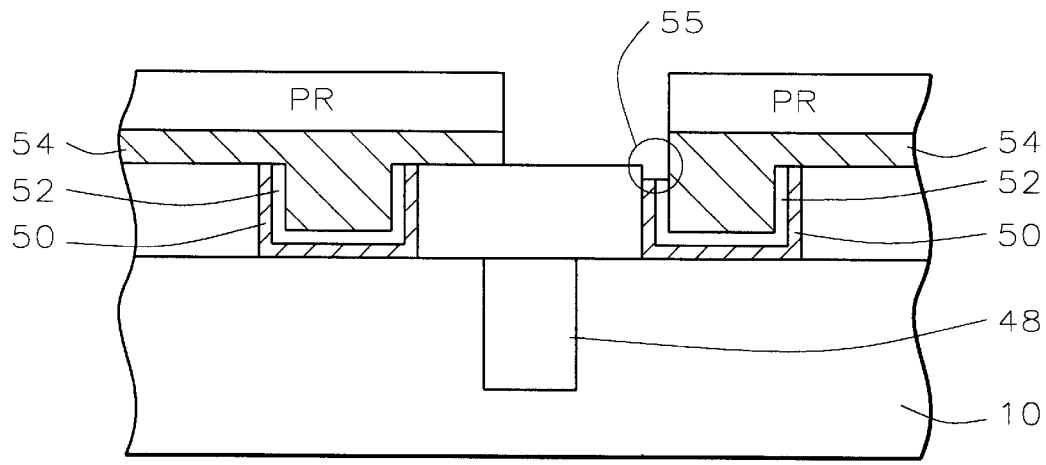
FIGS. 1 through 4 are schematic cross-sectional representations showing problems resolved by the present invention.

The process of the present invention provides a method for fabricating a CUB DRAM device that is tolerant to lithographic mis-alignment. For example, FIGS. 1 through 4 show a partially completed CUB DRAM device. It is to be understood that no portion of FIGS. 1 through 4 is admitted to be prior art as to the present invention. Rather, these simplified diagrams are provided in an effort to provide an improved understanding of the problems which are overcome by the invention. A landing plug 48 is shown within a semiconductor substrate 10. Other semiconductor device structures within the semiconductor substrate are not shown for simplicity. Crown-type capacitors are formed over the substrate, as shown, comprising bottom electrode 50, capacitor dielectric layer 52, and top electrode 54.

Figure 2:
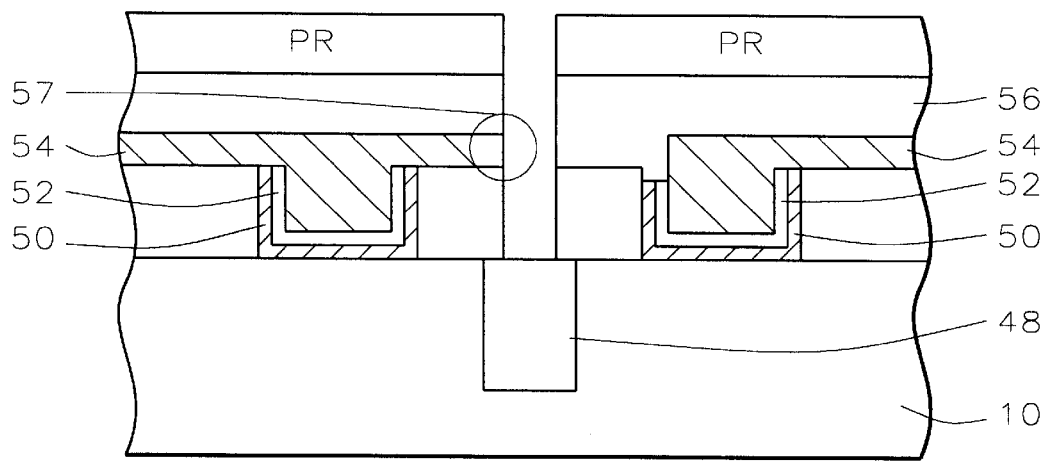

Referring now more particularly to FIG. 1, a photoresist mask PR is formed to pattern the top electrode. Because of the narrow process window in the patterning of bit line contacts, the CUB process becomes more and more difficult to implement, especially in advanced DRAM devices, beyond 256 Mb. For example, the photoresist mask PR is shown to be mis-aligned to the right in the FIG. Because of this mis-alignment, the crown is damaged as shown by 55. Now, when the bit line contact opening is patterned, as shown in FIG. 2, there will be a short between the bit line and the top electrode, as shown by 57, because of the previous mis-alignment.

Figure 3:
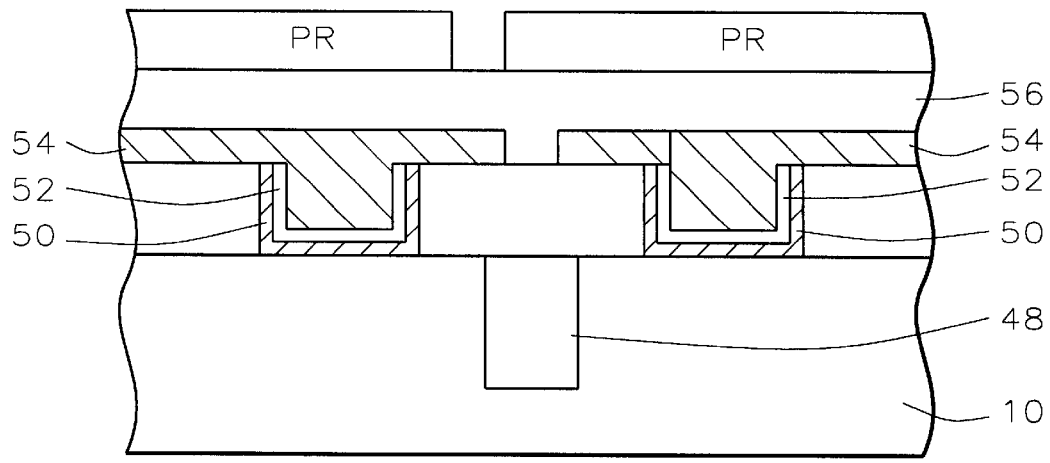
Figure 4:
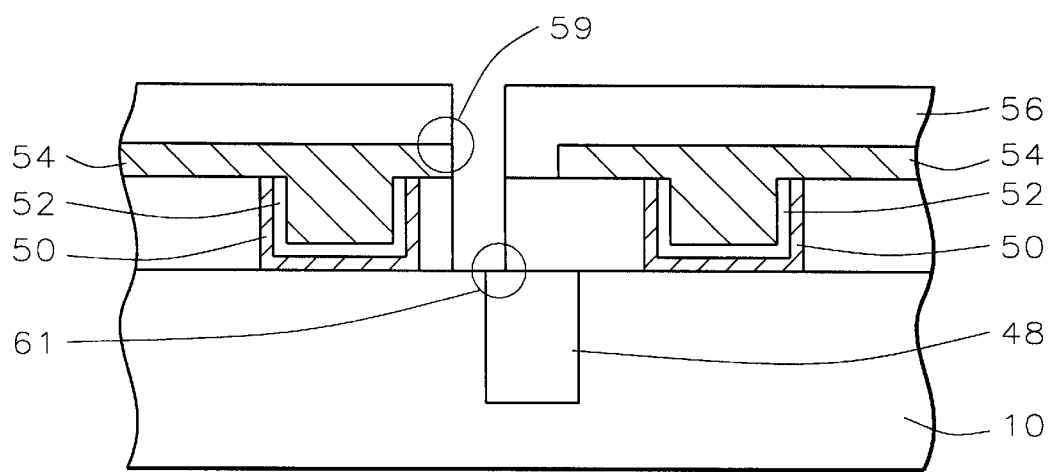

Referring now to FIG. 3, the crown capacitor is again shown. No mis-alignment has occurred during patterning of the top electrode. However, the photoresist mask PR for the bit line contact patterning is shown to be mis-aligned to the left. When the bit line contact opening is etched, as shown, in FIG. 4, there will be a short of the bit line to the top electrode as shown at 59 because of the mis-alignment. In addition, there is poor landing on the plug 48 as shown by 61.

Figure 5:
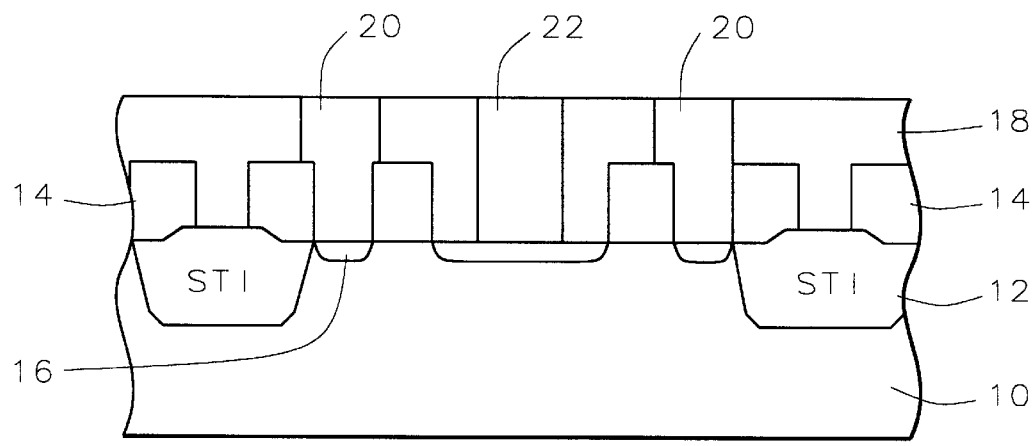

The process of the present invention prevents these misalignment problems by enlarging the process window for the bit line contact patterning. Referring now more particularly to FIG. 5, there is shown a partially completed integrated circuit device. The semiconductor substrate 10 is preferably composed of silicon having a (100) crystallographic orientation. Active areas are separated from each other by isolation regions, such as shallow trench isolation (STI) 12, for example. Semiconductor device structures are formed in and on the semiconductor substrate. These may include gate electrodes and word lines 14 and associated source and drain regions 16. The device structures are covered by a first insulating layer 18. Openings are etched through the insulating layer 18 to underlying source and drain regions 16. The openings are filled with a conducting layer, such as polysilicon. The polysilicon layer is removed except where it fills the openings to form plugs 20 and 22. Plugs 20 will act as node contacts for the capacitors while plug 22 is a landing plug for a bit line to be formed later.

Figure 6:
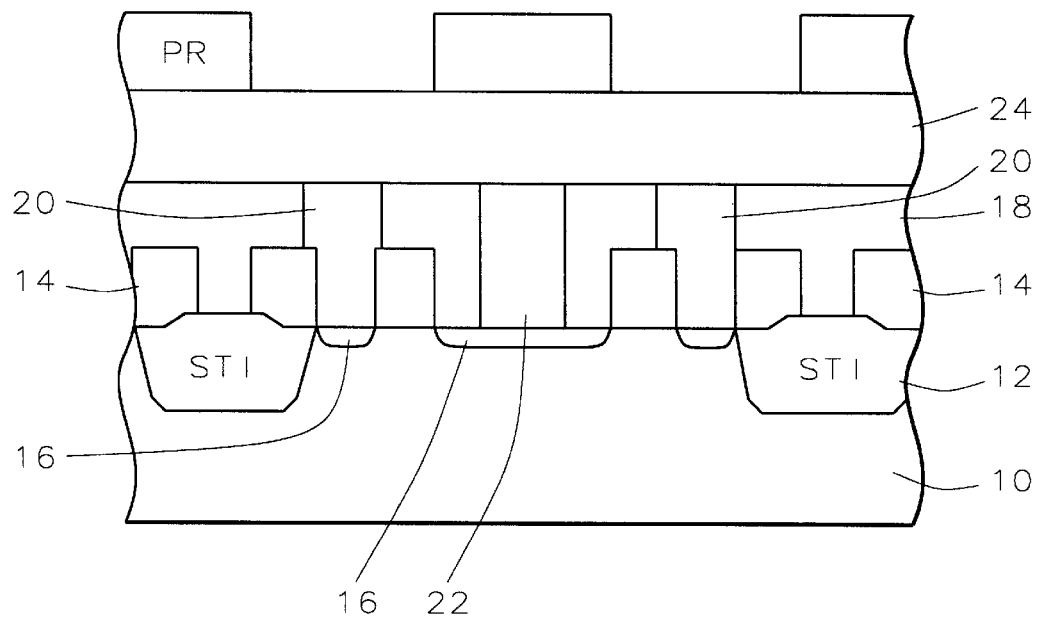

Referring now to FIG. 6, a second insulating layer 24 is deposited over the first insulating layer and the plugs 20 and 22. This layer 24 may comprise borophophosilicate glass (BPSG) or plasma-enhanced tetraethoxysilane (TEOS) oxide, for example, and may have a thickness of between about 8000 and 20,000 Angstroms. A photoresist mask PR is formed over the insulating layer, for example, having openings where the crown capacitors of the present invention are to be formed.

Figure 7:
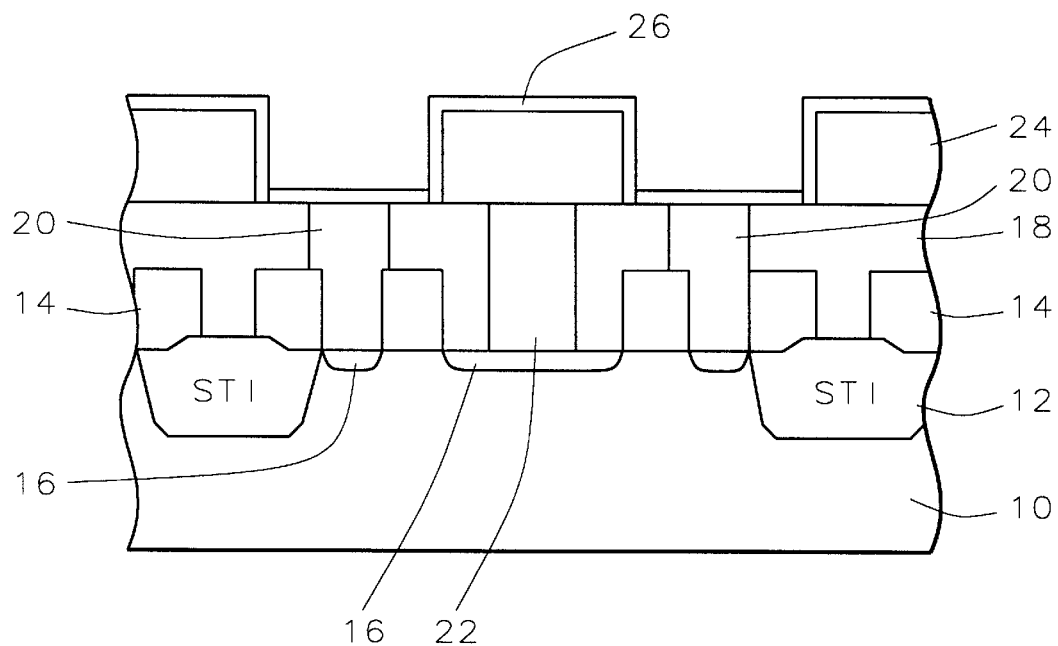

The insulating layer 24 is patterned to form openings to the node contact plugs 20 for the crown capacitors. As illustrated in FIG. 7, a layer of polysilicon 26 is deposited conformally over the insulating layer 24 and within the openings. The polysilicon layer is deposited by low pressure chemical vapor deposition (LPCVD) to a thickness of between about 500 and 1000 Angstroms. The polysilicon layer will form the bottom plate electrodes of the capacitors.

Figure 8:
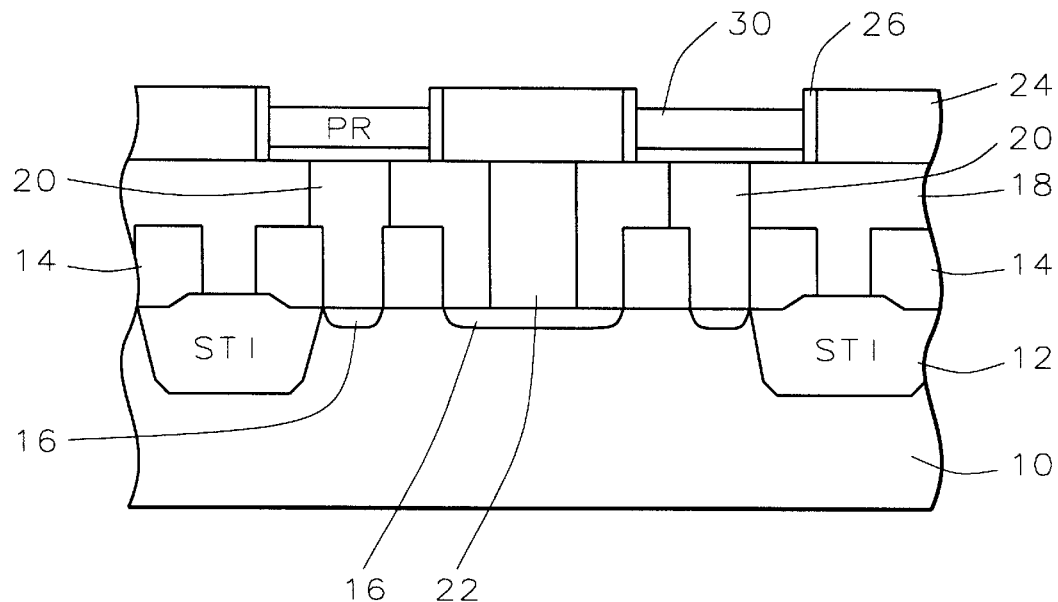

Referring now to FIG. 8, the polysilicon layer 26 and the insulating layer 24 are polished back, such as by chemical mechanical polishing (CMP) to isolate the bottom plates from one another by leaving the polysilicon layer 26 only within the capacitor openings.

Typically, a photoresist layer 30 may be coated over the polysilicon layer and left only within the capacitor openings, as shown in FIG. 8. The presence of the photoresist layer inside the crowns during CMP will prevent particle problems. Particles deposited within the crowns by the CMP process are easily removed when the photoresist 30 is removed. This photoresist coating 30 inside the crowns can perform another purpose in the process of the present invention. The photoresist coating 30 can be exposed and partially developed away to a depth of between about 1000 and 2000 Angstroms from the top surface of the capacitor openings.

Figure 9:
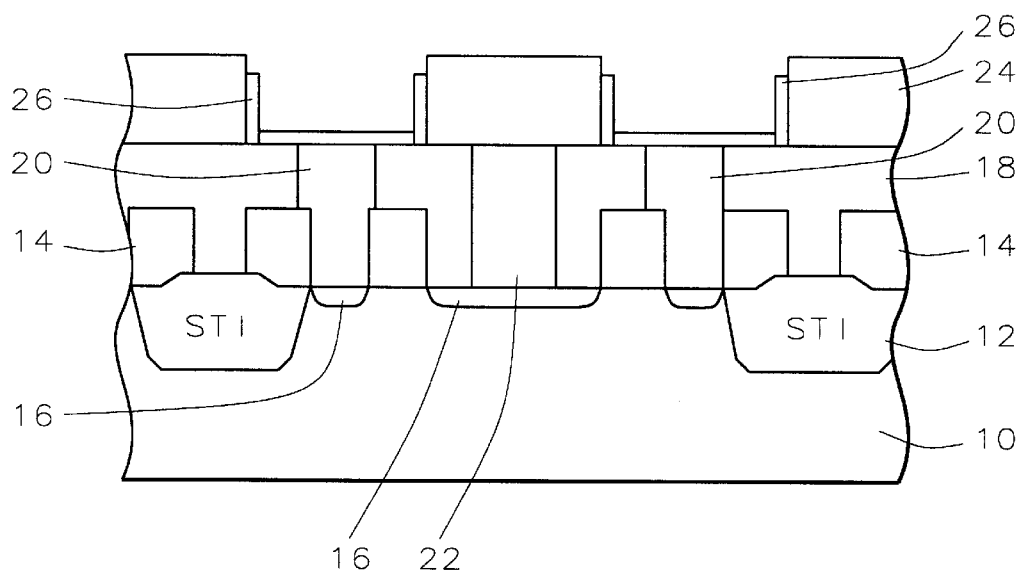

The bottom plate layer 26 is etched back using a blanket polysilicon etch, for example, to recess the bottom plate electrode from the top of the openings, as illustrated in FIG. 9. For example, a dry etch using $Cl_2$ or HBr may be used or a wet etch using $NH_4OH$ and $H_2O$ may be used. The photoresist layer is removed. Other methods may be used to recess the bottom plate electrode.

Figure 10A:
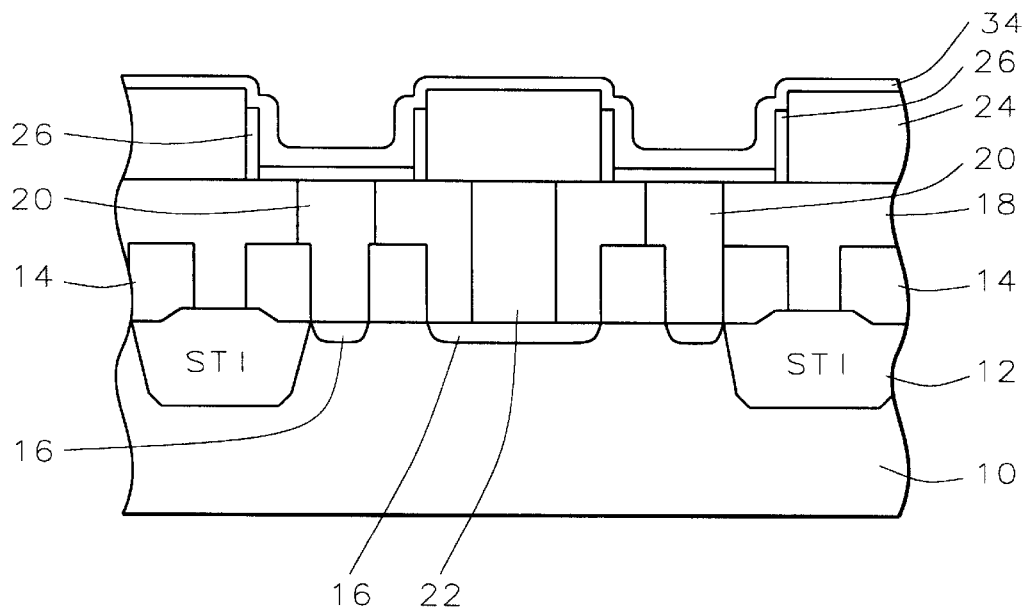
FIGS. 10A and 10B are schematic cross-sectional representations of two alternatives in a preferred embodiment of the present invention.

Referring now to FIG. 10A, a capacitor dielectric layer is deposited. For example, a layer of silicon nitride is deposited by LPCVD to a thickness of between about 40 and 60 Angstroms. Then a layer of silicon oxide is grown over the silicon nitride layer to form the NO layer 34.

Figure 10B:
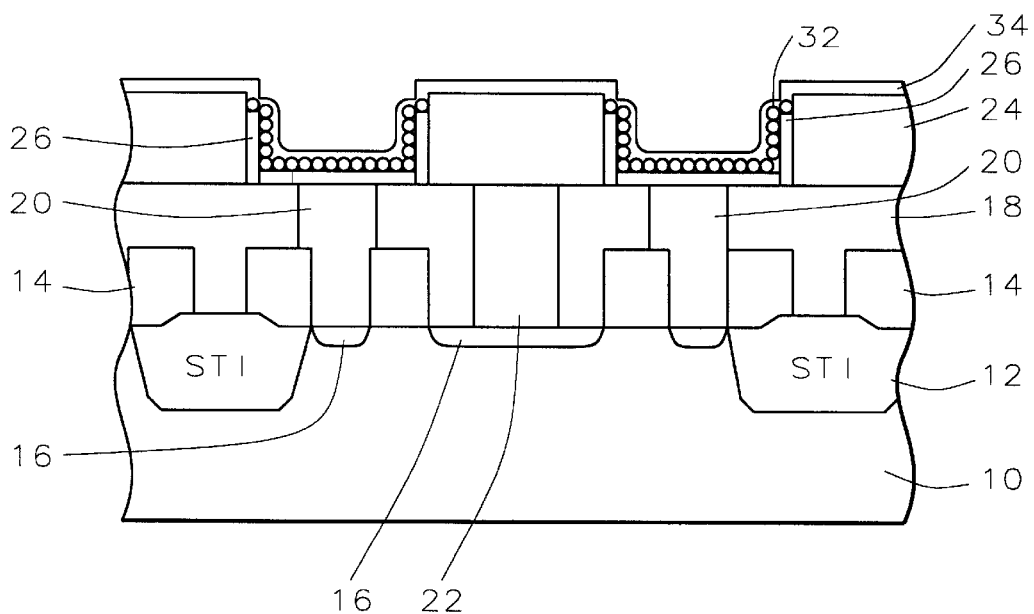

In an alternative, a selective hemispherical grain (HSG) process may be used to increase the surface area of the bottom polysilicon electrode. The bottom electrode 24 may be an amorphous silicon layer. The amorphous silicon layer can be recessed by the above described etching method. Then, an HSG layer 32, shown in FIG. 10B, can be grown on the recessed amorphous silicon layer. Capacitor dielectric layer 34 is formed on the HSG layer 32 as described above. It will be understood that the alternative illustrated in FIG. 10B can be applied to the subsequent FIGS., but will not be illustrated further.

Figure 11:
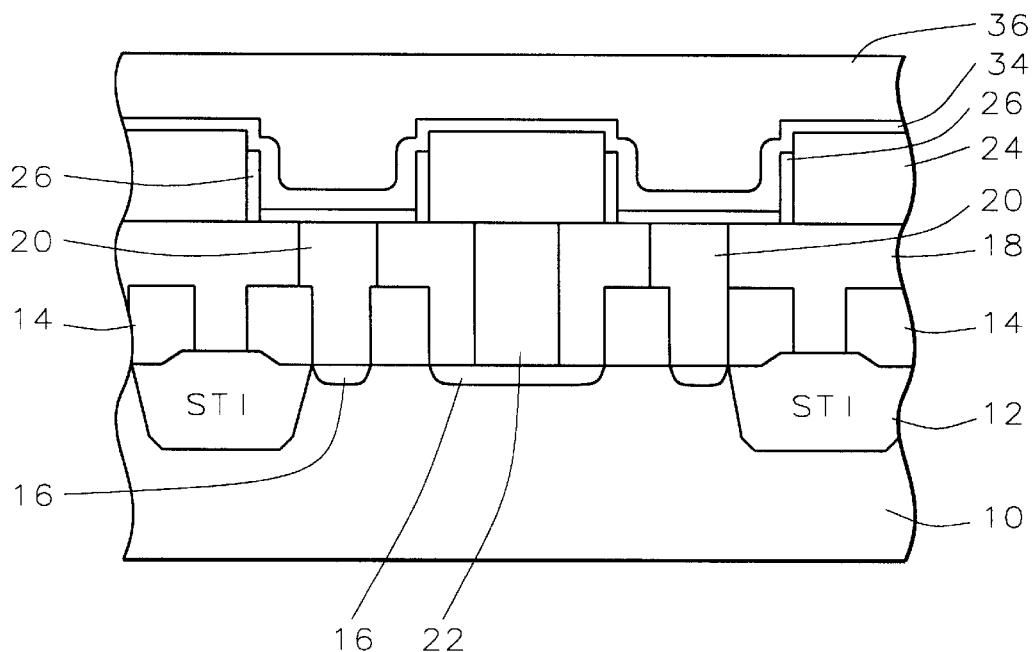

Now, referring to FIG. 11, a second polysilicon layer 36 is deposited to completely fill the space inside the crowns to form the top plate electrode of the capacitors.

Figure 12:
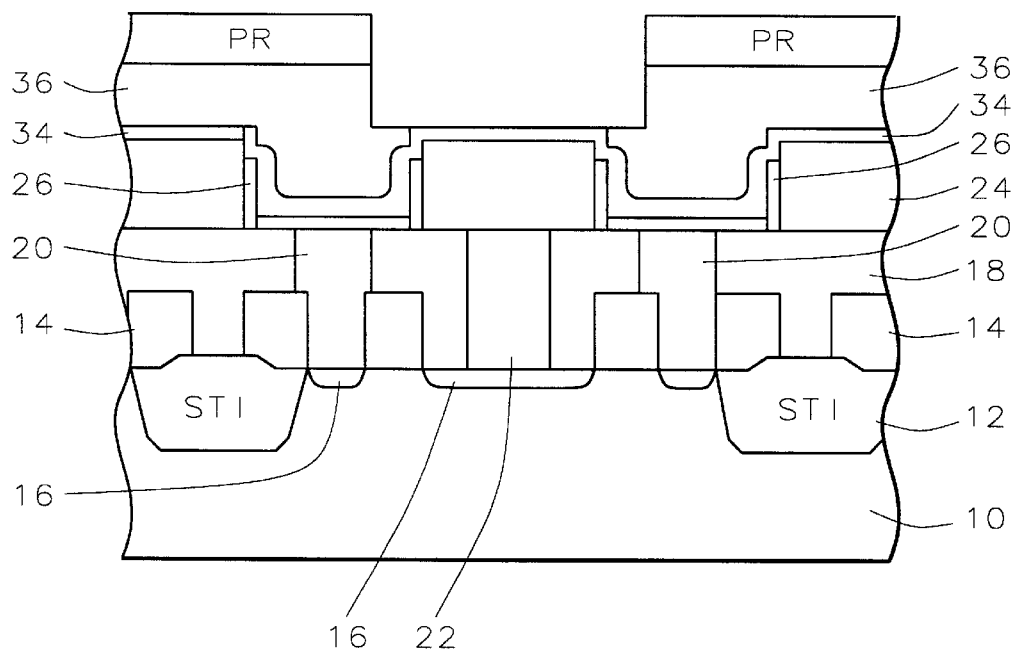

A photoresist mask PR, shown in FIG. 12, is formed over the substrate to define the capacitor top plates. Since the lower electrode is recessed, the lower electrode and the capacitor dielectric are free from etching damage during the patterning of the top electrodes. This is true even if the mask is mis-aligned. Also, because of the recessing of the lower electrode, the top plate opening can be much larger than conventional methods, as shown in FIG. 12. For example, the top plate opening can be between about 0.2 and 0.3 $\mu m$ larger than conventional top plate openings. This allows for a much larger process window.

Figure 15:
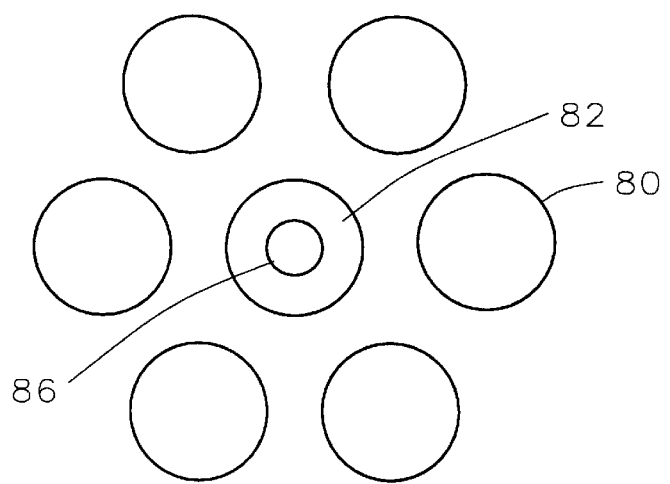
FIG. 15 is a top view of completed integrated circuit device of the prior art.
Figure 16:
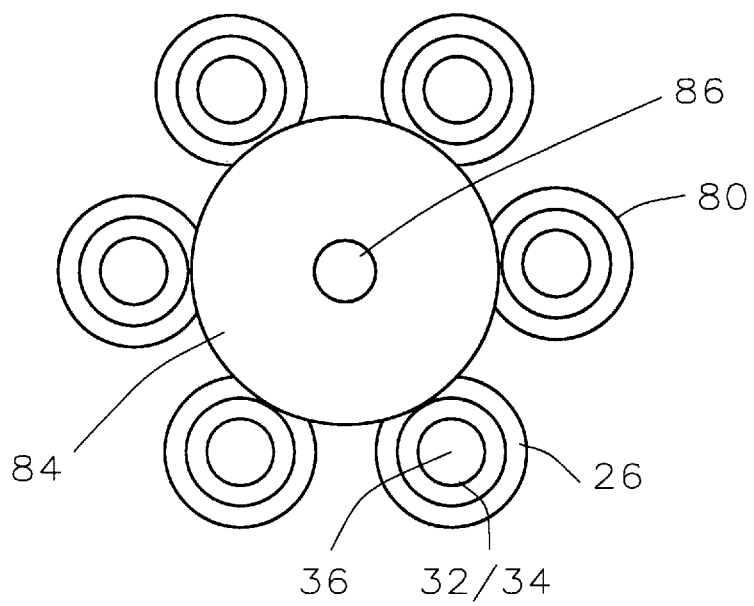
FIG. 16 is a top view of a completed integrated circuit device fabricated according to the process of the present invention.

FIGS. 15 and 16 illustrate a top view of a slice through a ring of crown capacitors 80. A conventionally sized top plate opening 82 is illustrated in FIG. 15 having a bit line contact 86 therethrough. FIG. 16 illustrates the larger sized top plate opening 84 of the present invention. This large size is made possible by the recessed lower electrode. Since there is no possibility of shorting because of mask mis-alignment, the plate opening can be much larger.

Figure 13:
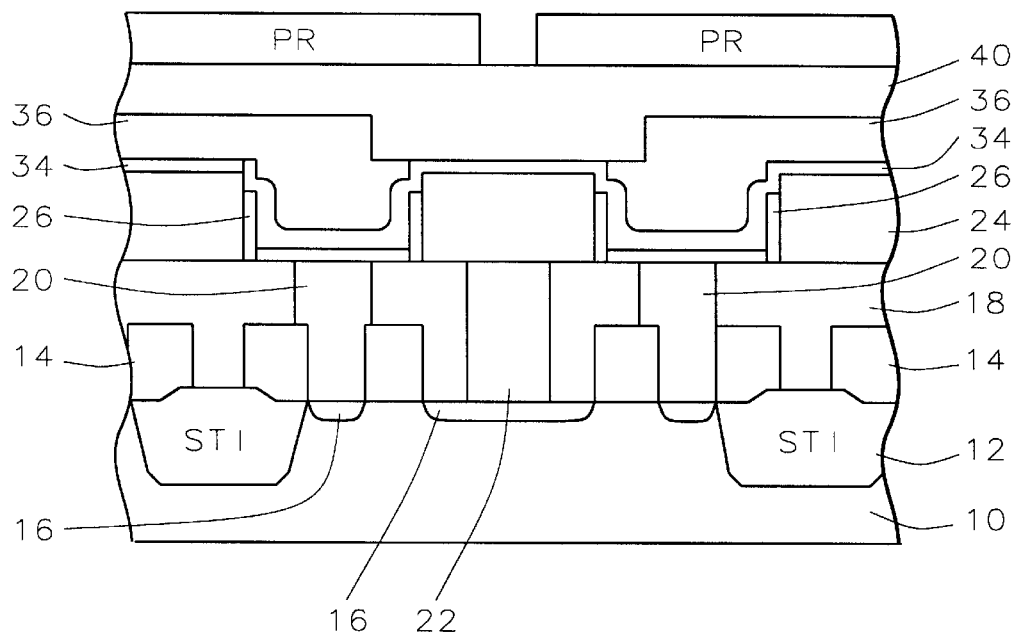
Figure 14:
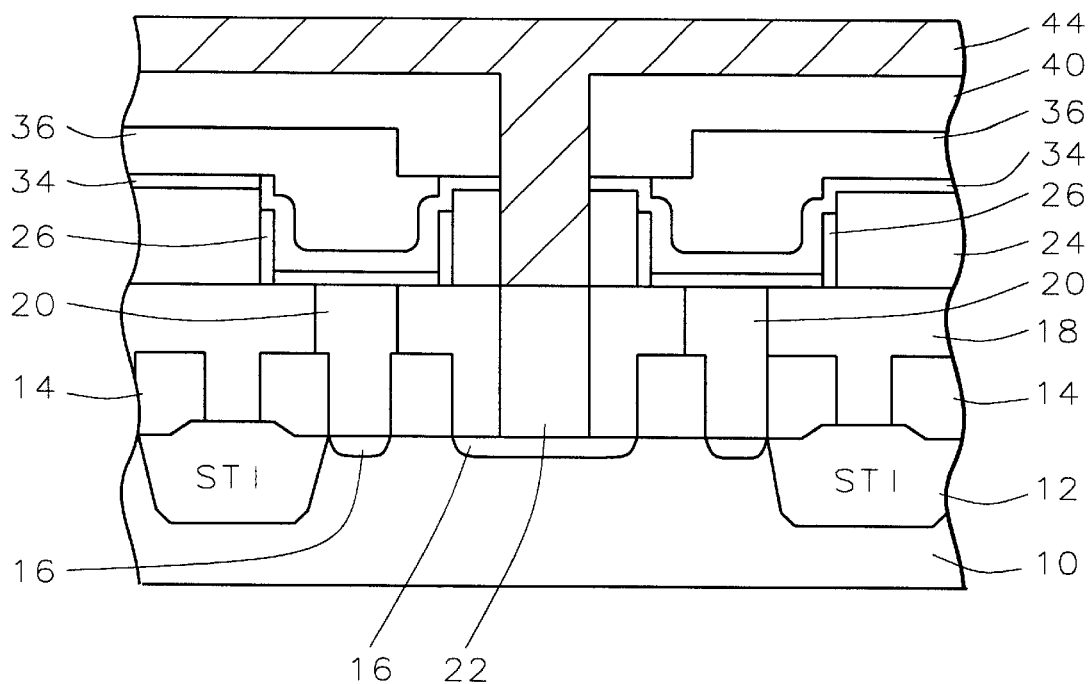

Returning now to FIG. 13, a third insulating layer 40 is deposited over the top plate electrodes 36. Now, a bit line contact opening is to be patterned. Photoresist mask PR is formed over the substrate with an opening for the bit line contact. The bit line contact opening is etched through the insulating layers to the landing plug 22, as shown in FIG. 14. The contact opening is filled with a conducting layer 44, such as tungsten having a titanium/titanium tungsten glue layer thereunder to complete the bit line contact. Misalignment of the bit line contact opening will not cause shorting between the bit line and the top plate electrode because of the recessed lower electrode and the larger top plate opening.

The process of the present invention provides an effective and very manufacturable process for fabricating a CUB DRAM device having an enlarged process window for bit line contact patterning. Shorting caused by lithographic mis-alignment is avoided by the process of the invention which recesses the lower electrode.

While the invention has been particularly shown and described with reference to the preferred embodiments thereof, it will be understood by those skilled in the art that various changes in form and details may be made without departing from the spirit and scope of the invention.

What is claimed is:

1. A method for fabricating a DRAM with capacitor under bit line (CUB) cell in an integrated circuit device comprising:

providing a plurality of capacitor node contact junctions and a bit line junction in a semiconductor substrate;

forming a node contact plug through a first insulating layer to each of said capacitor node contact junctions and forming a bit line contact plug to said bit line junction;

depositing a second insulating layer overlying said node contact plugs and etching openings through said second insulating layer to each of said node contact plugs;

conformally depositing a first conducting layer overlying said second insulating layer and within said openings;

removing said first conducting layer except where said first conducting layer lies within said openings;

coating a photoresist layer overlying said first conducting layer;

exposing said photoresist layer and partially developing away said photoresist layer wherein said photoresist layer remains only within said openings and wherein a top surface of said photoresist layer lies 1000 to 2000 Angstroms below a top surface of said openings;

thereafter etching away said first conducting layer where it is not covered by said photoresist layer whereby said first conducting layer is recessed by 1000 to 2000 Angstroms from said top surface of said openings wherein each of said first conducting layers forms a bottom plate electrode of said capacitor;

thereafter removing said photoresist layer;

thereafter forming a capacitor dielectric layer overlying said bottom plate electrodes and said second insulating layer;

depositing a second conducting layer overlying said capacitor dialectic layer and patterning said second conducting layer and said capacitor dielectric layer to form top capacitor plates overlying each of said bottom plate electrodes to complete said capacitors;

depositing a third insulating layer overlying said capacitors and etching an opening through said third and second insulating layers between said capacitors to said bit line contact plug; and filling said opening with a third conducting layer to form a bit line to complete fabrication of said DRAM with CUB cell in said integrated circuit device.

2. The method according to claim 1 wherein said first conducting layer comprises amorphous silicon and further comprising after said step of recessing said first conducting layer selectively growing a hemispherical grain (HSG) layer on said amorphous silicon layer to increase surface area of said bottom electrode.

3. The method according to claim 1 wherein said step of forming said capacitor dielectric layer comprises: depositing a silicon nitride layer to a thickness of between about 40 and 60 Angstroms overlying said bottom electrode; and growing a silicon oxide layer overlying said silicon nitride layer to complete said capacitor dielectric layer.

4. The method according to claim 1 wherein said node contact plugs comprise polysilicon.

5. The method according to claim 1 wherein said bit line contact plug comprises polysilicon.

6. The method according to claim 1 wherein said first conducting layer is polysilicon or amorphous silicon layer and wherein said first conducting layer is deposited to a thickness of between about 500 and 1000 Angstroms.

7. The method according to claim 1 wherein said step of removing said first conducting layer comprises chemical mechanical polishing.

8. The method according to claim 1 wherein said step of recessing said first conducting layer is a dry etch or a wet etch.

9. A method for fabricating a DRAM with capacitor under bit line (CUB) cell in an integrated circuit device comprising:

providing a plurality of capacitor node contact junctions and a bit line junction in a semiconductor substrate;

forming a node contact plug through a first insulating layer to each of said capacitor node contact junctions and forming a bit line contact plug to said bit line junction;

depositing a second insulating layer overlying said node contact plugs and etching openings through said second insulating layer to each of said node contact plugs;

conformally depositing a first conducting layer overlying said second insulating layer and within said openings;

removing said first conducting layer except where said first conducting layer lies within said openings;

recessing said first conducting layer below top of said openings wherein each of said first conducting layers forms a bottom plate electrode of said capacitor;

thereafter forming a capacitor dielectric layer overlying said bottom plate electrodes and said second insulating layer wherein said capacitor dielectric layer is formed by:

depositing a silicon nitride layer overlying said bottom plate electrodes; and growing a silicon oxide layer overlying said silicon nitride layer;

depositing a second conducting layer overlying said capacitor dielectric layer and patterning said second conducting layer and said capacitor dielectric layer to form top capacitor plates overlying each of said bottom plate electrodes to complete said capacitors;

depositing a third insulating layer overlying said capacitors and etching an opening through said third and second insulating layers between said capacitors to said bit line contact plug; and filling said opening with a third conducting layer to form a bit line to complete fabrication of said DRAM with CUB cell in said integrated circuit device.

10. The method according to claim 9 wherein said node contact plugs comprise polysilicon.

11. The method according to claim 9 wherein said bit line contact plug comprises polysilicon.

12. The method according to claim 9 wherein said first conducting layer is selected from the group consisting of polysilicon and amorphous silicon and wherein said first conducting layer has a thickness of between about 500 and 1000 Angstroms.

13. The method according to claim 9 wherein said step of removing said first conducting layer comprises chemical mechanical polishing.

14. The method according to claim 9 wherein said step of recessing said first conducting layer is selected from the group consisting of: a dry etch and a wet etch and wherein said first conducting layer is recessed by 1000 to 2000 Angstroms from a top surface of said openings.

15. The method according to claim 9 wherein said step of recessing said first conducting layer comprises:

coating a photoresist layer overlying said first conducting layer;

exposing said photoresist layer and partially developing away said photoresist layer wherein said photoresist layer remains only within said openings and wherein a top surface of said photoresist layer lies 1000 to 2000 Angstroms below a top surface of said openings;

thereafter etching away said first conducting layer where it is not covered by said photoresist layer whereby said first conducting layer is recessed by 1000 to 2000 Angstroms from said top surface of said openings; and removing said photoresist layer.

16. The method according to claim 9 wherein said first conducting layer comprises amorphous silicon and further comprising selectively growing a hemispherical grain (HSG) layer on said amorphous silicon layer to increase surface area of said bottom electrode before said step of forming said capacitor dielectric layer.

17. The method according to claim 9 wherein said silicon nitride layer is deposited to a thickness of between about 40 and 60 Angstroms and wherein said silicon oxide layer is grown to a thickness of between about 50 and 200 Angstroms.

18. A method for fabricating a DRAM with capacitor under bit line (CUB) cell in an integrated circuit device comprising:

providing a plurality of capacitor node contact junctions and a bit line junction in a semiconductor substrate;

forming a node contact plug through a first insulating layer to each of said capacitor node contact junctions and forming a bit line contact plug to said bit line junction;

depositing a second insulating layer overlying said node contact plugs and etching openings through said second insulating layer to each of said node contact plugs;

conformally depositing a first conducting layer overlying said second insulating layer and within said openings;

removing said first conducting layer except where said first conducting layer lies within said openings;

recessing said first conducting layer a distance of between 1000 and 2000 Angstroms below top of said openings wherein each of said first conducting layers forms a bottom plate electrode of said capacitor;

thereafter forming a capacitor dielectric layer overlying said bottom plate electrodes and said second insulating layer wherein said capacitor dielectric layer is formed by:

depositing a silicon nitride layer overlying said bottom plate electrodes; and growing a silicon oxide layer overlying said silicon nitride layer;

depositing a second conducting layer overlying said capacitor dielectric layer and patterning said second conducting layer and said capacitor dielectric layer to form top capacitor plates overlying each of said bottom plate electrodes to complete said capacitors;

depositing a third insulating layer overlying said capacitors and etching an opening through said third and second insulating layers between said capacitors to said bit line contact plug; and filling said opening with a third conducting layer to form a bit line to complete fabrication of said DRAM with CUB cell in said integrated circuit device.

19. The method according to claim 18 wherein said node contact plugs comprise polysilicon.

20. The method according to claim 18 wherein said bit line contact plug comprises polysilicon.

21. The method according to claim 18 wherein said first conducting layer is selected from the group consisting of polysilicon and amorphous silicon and wherein said first conducting layer has a thickness of between about 500 and 1000 Angstroms.

22. The method according to claim 18 wherein said step of removing said first conducting layer comprises chemical mechanical polishing.

23. The method according to claim 18 wherein said step of recessing said first conducting layer is selected from the group consisting of: a dry etch and a wet etch and wherein said first conducting layer is recessed by 1000 to 2000 Angstroms from a top surface of said openings.

24. The method according to claim 18 wherein said step of recessing said first conducting layer comprises:

coating a photoresist layer overlying said first conducting layer;

exposing said photoresist layer and partially developing away said photoresist layer wherein said photoresist layer remains only within said openings and wherein a top surface of said photoresist layer lies 1000 to 2000 Angstroms below a top surface of said openings;

thereafter etching away said first conducting layer where it is not covered by said photoresist layer whereby said first conducting.layer is recessed by 1000 to 2000 Angstroms from said top surface of said openings; and removing said photoresist layer.

25. The method according to claim 18 wherein said first conducting layer comprises amorphous silicon and further comprising selectively growing a hemispherical grain (HSG) layer on said amorphous silicon layer to increase surface area of said bottom electrode before said step of forming said capacitor dielectric layer.

26. The method according to claim 18 wherein said silicon nitride layer is deposited to a thickness of between about 40 and 60 Angstroms and wherein said silicon oxide layer is grown to a thickness of between about 50 and 200 Angstroms.

* * * * *